(12) United States Patent
Gibson et al.

(10) Patent No.: US 6,765,284 B2
(45) Date of Patent: Jul. 20, 2004

(54) LEADFRAME INDUCTORS

(75) Inventors: Joel Robert Gibson, Chandler, AZ (US); Marnie Ann Knadler, Phoenix, AZ (US)

(73) Assignee: RF Micro Devices, Inc., Greensboro, NC (US)

( * ) Notice: Subject to any disclaimer, the term of this patent is extended or adjusted under 35 U.S.C. 154(b) by 9 days.

(21) Appl. No.: 10/456,320

(22) Filed: Jun. 6, 2003

(65) Prior Publication Data

US 2003/0209730 A1 Nov. 13, 2003

Related U.S. Application Data

(60) Continuation of application No. 10/370,234, filed on Feb. 20, 2003, now Pat. No. 6,608,367, which is a division of application No. 10/082,380, filed on Feb. 25, 2002, now Pat. No. 6,621,140.

(51) Int. Cl.[7] .............................................. H01L 29/44
(52) U.S. Cl. ...................................... 257/666; 257/670
(58) Field of Search ................................ 257/666, 670, 257/531

(56) References Cited

U.S. PATENT DOCUMENTS

| | | | |
|---|---|---|---|
| 5,065,224 A | 11/1991 | Fraser et al. ................... | 357/70 |
| 5,309,019 A | 5/1994 | Moline et al. ............... | 257/670 |
| 5,428,245 A | 6/1995 | Lin et al. ..................... | 257/666 |
| 5,442,228 A | 8/1995 | Pham et al. .................. | 257/659 |
| 5,804,880 A | 9/1998 | Mathew ....................... | 257/779 |
| 5,834,837 A | 11/1998 | Song ........................... | 257/692 |
| 5,839,184 A | 11/1998 | Ho et al. ...................... | 29/605 |
| 5,869,884 A | 2/1999 | Kimoto ........................ | 29/605 |
| 5,913,551 A | 6/1999 | Tsutsumi et al. ............. | 29/605 |
| 6,008,073 A | 12/1999 | King et al. ................... | 438/123 |
| 6,097,203 A | 8/2000 | Parker et al. ................ | 324/763 |
| 6,143,981 A | 11/2000 | Glenn ........................ | 174/52.4 |
| 6,157,074 A | 12/2000 | Lee ............................. | 257/666 |
| 6,180,433 B1 | 1/2001 | Furey et al. ................. | 438/106 |
| 6,211,462 B1 | 4/2001 | Carter, Jr. et al. ......... | 174/52.4 |
| 6,265,761 B1 | 7/2001 | Ghai ........................... | 257/666 |
| 6,281,568 B1 | 8/2001 | Glenn et al. ................. | 257/684 |
| 6,323,735 B1 | 11/2001 | Welland et al. .............. | 331/36 |
| 6,335,564 B1 | 1/2002 | Pour ........................... | 257/666 |
| 6,608,367 B1 * | 8/2003 | Gibson et al. .............. | 257/666 |
| 6,621,140 B1 * | 9/2003 | Gibson et al. .............. | 257/531 |
| 2001/0002065 A1 | 5/2001 | Drehobl et al. ............. | 257/678 |

FOREIGN PATENT DOCUMENTS

| | | | | |
|---|---|---|---|---|
| JP | 06104372 | 4/1994 | ........... | H01L/23/50 |
| JP | 9213868 | 8/1997 | ........... | H01L/23/50 |
| JP | 10150068 | 6/1998 | ........... | H01L/21/60 |
| KR | 20000140458 B1 | 3/1998 | ......... | H01L/23/495 |

OTHER PUBLICATIONS

International Search Report for PCT/US03/03031, mailed Oct. 9, 2003.

* cited by examiner

*Primary Examiner*—M. Tran
(74) *Attorney, Agent, or Firm*—Withrow & Terranova, PLLC

(57) ABSTRACT

The present invention integrates an inductor into a semiconductor package by integrally forming inductive segments in the leadframe. The inductive segments may be connected directly to a lead of the leadframe, or indirectly to a lead or a bond pad on a semiconductor die via wirebonds to form an inductor. The inductance value for the resultant inductor is typically controlled by the point of contact for the wirebonds or the leads about the inductive segment. The inductance values may also be controlled by the shape and size of the inductive segments. The leadframe may be formed to support multiple inductive segments, and one or more configurations, including those using one or more die flags to support a like number of semiconductor die.

24 Claims, 8 Drawing Sheets

INDUCTIVE SEGMENTS 22

LEADFRAME INDUCTORS

This application is a Continuation of application Ser. No. 10/370,234, filed Feb. 20, 2003, now U.S. Pat. No. 6,608,367 which is a Divisional of application Ser. No. 10/082,380, filed Feb. 25, 2003 now U.S. Pat. No. 6,621,140.

FIELD OF THE INVENTION

The present invention relates to inductors, and in particular to forming inductors in leadframes for semiconductor packages.

BACKGROUND OF THE INVENTION

Industry trends in wireless communications are forcing increased integration, size reduction, and cost reduction. Many radio frequency circuits require matching, filtering, and biasing networks, which require inductors having relatively high inductance values with low loss. In general, the higher the inductance value, the larger and more expensive the inductor. Further, the precision of the inductance for the inductor is proportional to its cost. In many applications, inductors contribute a significant portion of the overall cost of circuit implementation.

Traditionally, there have been four options available for providing inductance in association with an integrated circuit. The first and most common option is for the end manufacturer to add discrete inductors in their final assemblies in association with other integrated circuits and discrete components. Adding discrete inductors is an unattractive option for the end manufacturer due to the physical space required on the final assembly for the inductor and the cost of the inductor.

A second option is to implement the inductor using wirebonds. Wirebonds are thin wires or ribbons that typically connect portions of a semiconductor die to the leads in the semiconductor package. When implementing an inductor, the wirebonds may be used in traditional fashion between a bond pad on the semiconductor die and a lead, as well as between bond pads on the semiconductor die. Unfortunately, wirebonds provide limited inductance and have proven to be electrically lossy. A third option is to actually create or place an inductor on the semiconductor die. Implementing an inductor on a semiconductor die has proven to be very expensive, electrically lossy, and given the limited size of the die, unfeasible in providing higher inductance values.

A fourth option is to design a module package having a substrate on which an inductor may be incorporated through surface mount or printed circuit board fabrication techniques. This option has the same limitations as having the end manufacturer incorporate the inductor in its final assembly. The result is essentially passing the cost on to the module fabricator instead of the final assembler.

Accordingly, there is a need for a cost-effective technique for implementing and integrating inductors into semiconductor packages. There is a further need for these inductors to have sufficient inductance for matching, filtering, and biasing networks in wireless communication applications.

SUMMARY OF THE INVENTION

The present invention integrates an inductor into a semiconductor package by integrally forming inductive segments in the leadframe. The inductive segments may be connected directly to a lead of the leadframe, or indirectly to a lead or a bond pad on a semiconductor die via wirebonds to form an inductor. The inductance value for the resultant inductor is typically controlled by the point of contact for the wirebonds or the leads about the inductive segment. The inductance values may also be controlled by the shape and size of the inductive segments. The leadframe may be formed to support multiple inductive segments, and one or more configurations, including those using one or more die flags to support a like number of semiconductor die.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
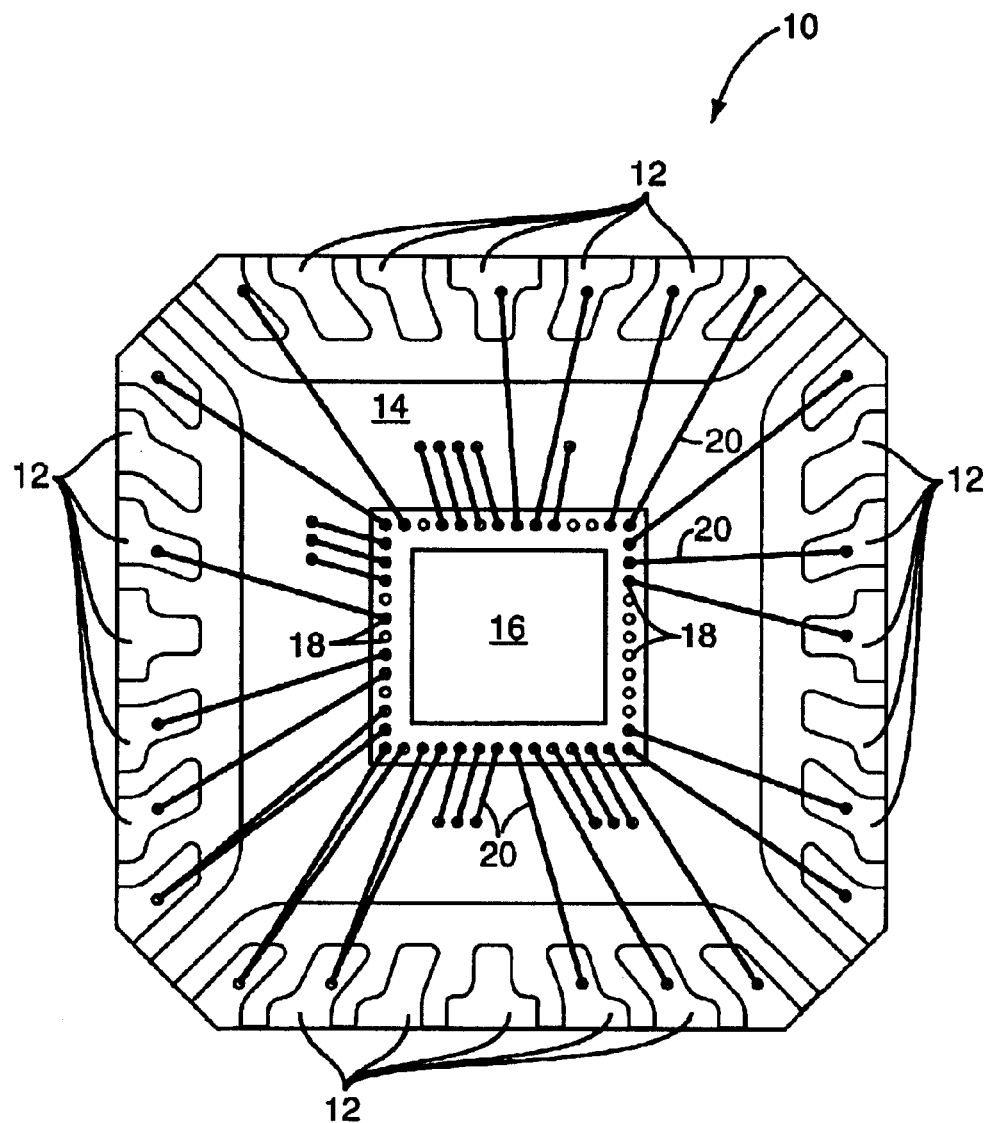
FIG. 1 is a top view of a traditional leadframe package having an attached semiconductor die according to the prior art.

With reference to FIG. 1, a configuration for a typical leadframe 10 is illustrated to include multiple leads 12 about the periphery of a die flag 14. The leads 12 and die flag 14 are generally formed of the same material, have the same, uniform thickness throughout the leadframe 10, with the exception of mold locking features, which are less thick, and are electrically isolated from one another. Although FIG. 1 illustrates the top portion of a leadframe 10, the bottom portion of the leads 12 and die flag 14 are left exposed to facilitate contact with electrical contacts or traces of a substrate or printed circuit board (PCB), which will be described in greater detail below. A semiconductor die 16 having bond pads 18 is placed on the die flag 14. Wirebonds 20 are used to connect select ones of the bond pads 18 to one or more corresponding leads 12 of the leadframe 10. Notably, the term "wirebond" includes traditional wirebonds, ribbon bonds, and any conductive configuration used to selectively connect the semiconductor die 16 to parts of the leadframe 10.

As noted, the bottom of the leads 12 and die flag 14 generally facilitate electrical contact to other circuitry. Typically, the semiconductor die 16 is attached to the die flag 14 using a conductive or nonconductive bonding dielectric and any connections from the semiconductor die 16 to the die flag 14 are facilitated using wirebonds 20. In most embodiments, the die flag 14 provides a ground contact, wherein the leads 12 facilitate signal contact to the semiconductor die 16 via the wirebonds 20. Notably, the leads 12 and die flag 14 that make up leadframe 10 of prior art devices are only used for contacts with external traces on substrates or PCBs.

Figure 2:
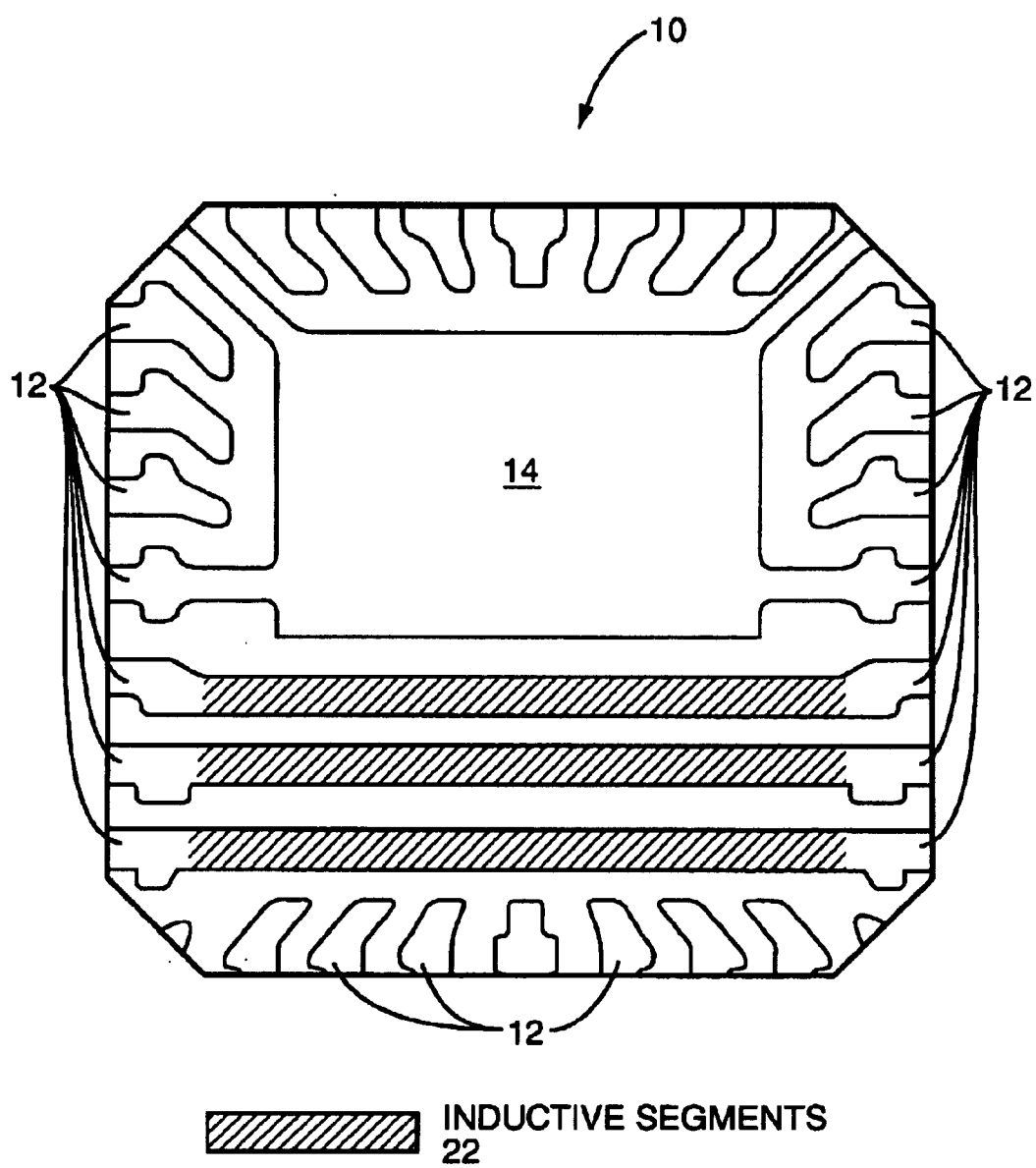
FIG. 2 is a leadframe constructed according to one embodiment of the present invention.

Turning now to FIG. 2, a leadframe 10 according to one embodiment of the present invention is illustrated. The leadframe 10 includes leads 12 and a die flag 14, as well as inductive segments 22, which are part of the leadframe and are capable of being used to form inductors. As illustrated, the three inductive segments 22 are parallel to one another and run between respectively opposing leads 12. Preferably, the leads 12 and the die flag 14 have a uniform thickness, wherein the inductive segments 22 have a thickness sufficiently less than the leads 12 and die flag 14 to allow the bottom portion of the inductive segments 22 to avoid contact with a substrate or PCB to which the bottom of the leads 12 and die flag 14 will contact.

Figure 3:
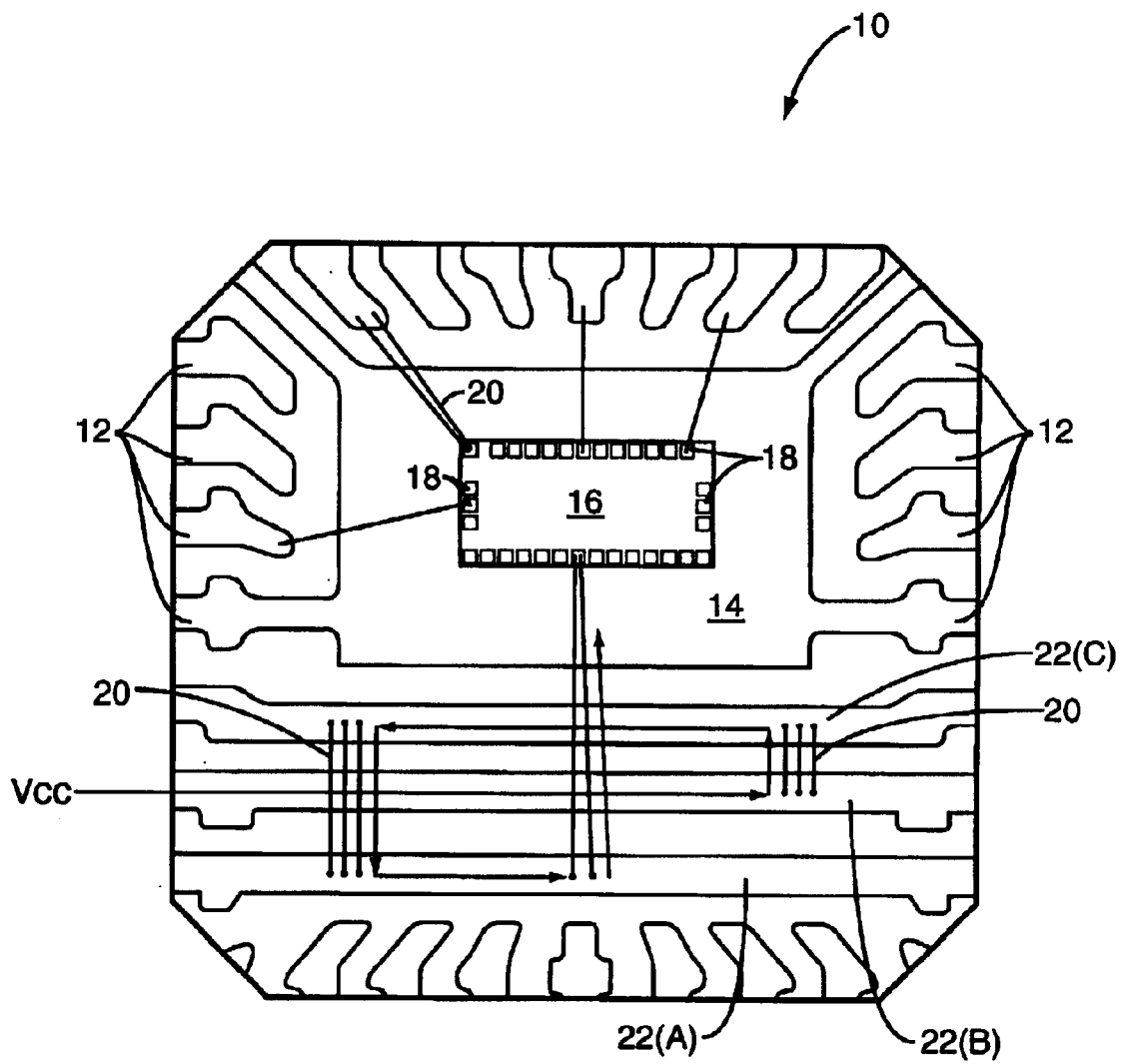
FIG. 3 is the leadframe of FIG. 2 having an attached semiconductor die and an inductor integrated into the leadframe according to one embodiment of the present invention.

Turning now to FIG. 3, the leadframe 10 of FIG. 2 is illustrated as having a semiconductor die 16 and select wirebonds 20 to illustrate certain connections from the semiconductor die 16 to the leads 12, as well as connections to the inductive segments 22 to form an inductor. Notably, only select bond pads 18 and wirebonds 20 are shown for clarity. Further, each of the inductive segments 22 is further referenced as either inductive segment 22(A), 22(B), or 22(C) for clarity. In addition to the normal wirebond connections between bond pads 18 and leads 12, two wirebonds 20 are shown connecting a bond pad 18 to the inductive segment 22(A). Three wirebonds 20 connect inductive segment 22(B) to 22(C), and another three wirebonds 20 connect inductive segment 22(A) to 22(C). Multiple wirebonds 20 may be used in parallel to facilitate higher current flow and minimize resistive losses associated with the wirebonds 20. Assume that the lead 12 labeled VCC is intended to couple to a supply voltage wherein current from the supply voltage must travel through an inductor prior to reaching the semiconductor die 16. Accordingly, the current path is illustrated as traveling from the VCC lead 12 along inductive segment 22(B), over to inductive segment 22(C) via wirebonds 20, along inductive segment 22(C), over to inductive segment 22(A) via wirebonds 20, partially across inductive segment 22(A), and over to the semiconductor die 16 via wirebonds 20. In this fashion, a large inductor can be implemented in the leadframe 10 using existing leadframe material and providing a strategic leadframe pattern and wirebond connections.

Those skilled in the art should note that an inductor may be implemented using only one inductive segment 22, and that the example illustrated is provided only to show a more complicated example and the use of wirebonds 20 to facilitate interconnection between inductive segments 22 and between inductive segments 22 and semiconductor die 16. Further, an inductor may be connected between bond pads 18 of the semiconductor die 16 without connecting to a lead 12. Also, the leadframe 10 may be designed to provide an inductor between leads 12 without having any interaction with the semiconductor die 16, such that the leadframe 10 provides an isolated inductive element for use by other circuitry outside of the given semiconductor die 16.

Figure 4:
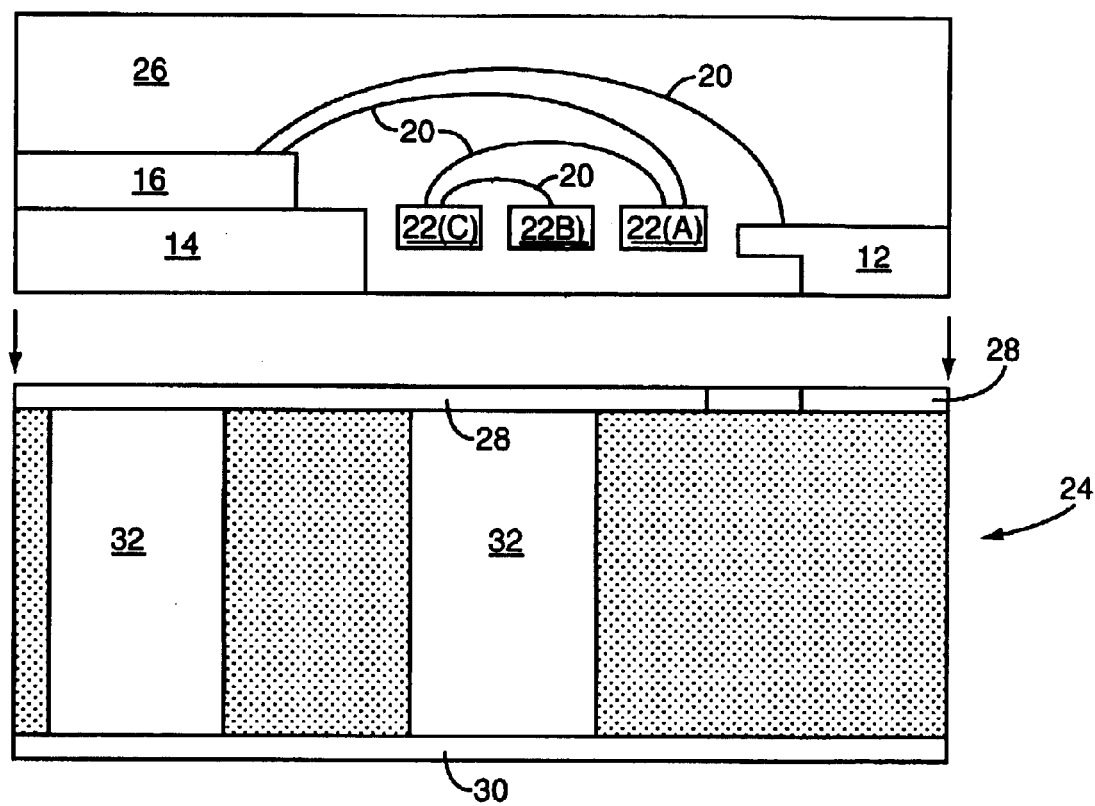
FIG. 4 is a partial cross-section of a semiconductor having the leadframe illustrated in FIG. 3 and an associated printed circuit board or mounting substrate.

Turning now to FIG. 4, a partial cross-section of a complete semiconductor and a corresponding portion of a printed circuit board upon which the semiconductor will mount is illustrated. As shown, the inductive segments 22(A)–22(C) are not as thick as the corresponding lead 12 and die flag 14. A molding compound 26 is used to encase all of the elements of the semiconductor, while leaving only the bottom surfaces of the lead 12 and die flag 14 exposed to facilitate contact to the printed circuit board 24. In particular, contact is made to conductive traces 28 on the top surface of the PCB 24. The PCB 24 may also have conductive traces 30 along the bottom surface and vias 32 connecting the top and bottom traces 28, 30.

The molding compound 26 may serve to isolate the inductive segments 22(A)–22(C) from the conductive traces 28, as well as hold the inductive segments 22(A)–22(C), leads 12, die flag 14, semiconductor die 16, and wirebonds 20 in place. Preferably, the lead 12 may be formed with an undercut region to enhance structural integrity and allow the molding compound 26 to set in a way that forms a better mechanical connection to the lead 12. Notably, portions of the leadframe 10, including the inductive segments 22, may extend outside of the semiconductor molding compound 26.

Figure 5:
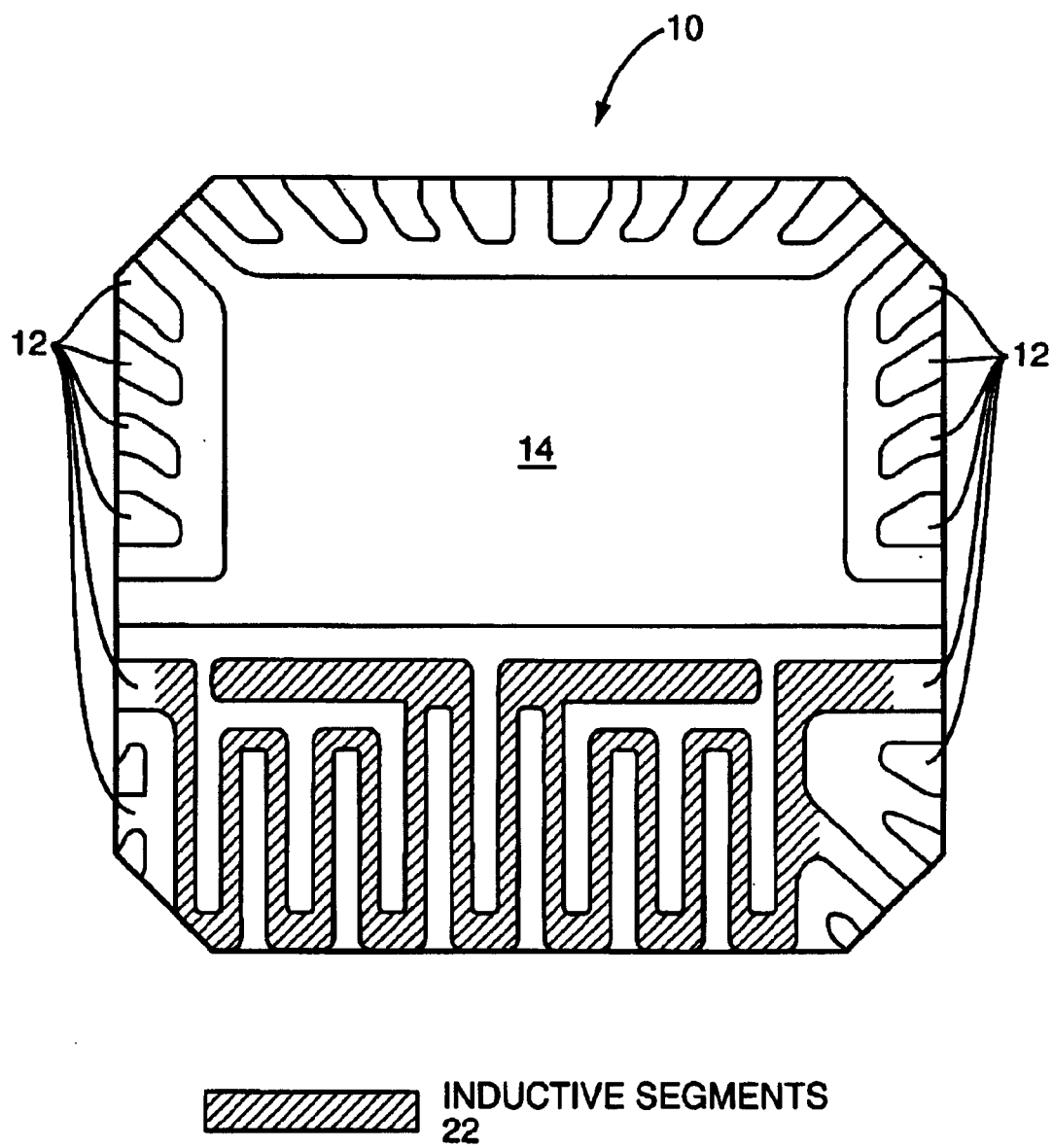
FIG. 5 is an alternate leadframe configuration according to a second embodiment of the present invention.
Figure 6:
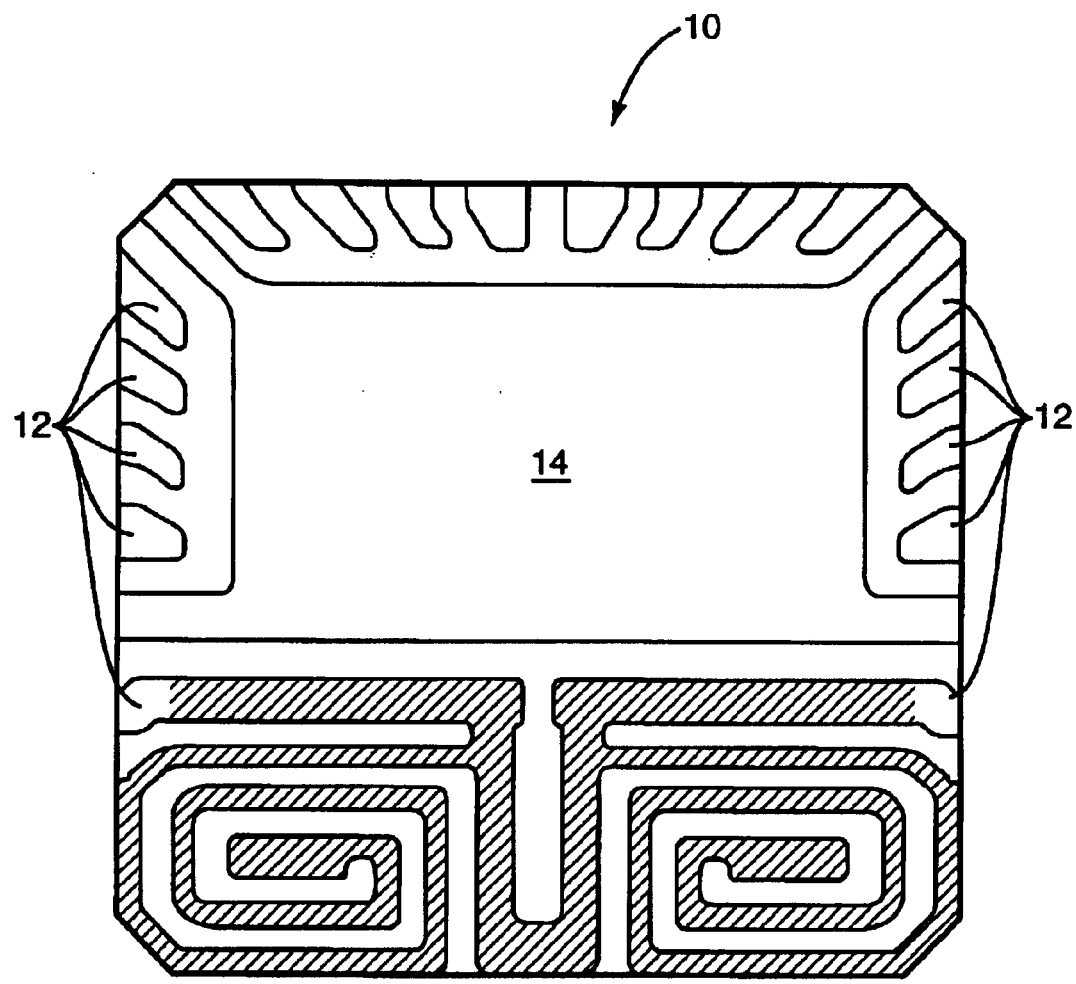
FIG. 6 is an alternate leadframe configuration according to a third embodiment of the present invention.
Figure 6:
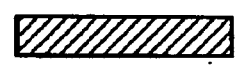
Figure 7:
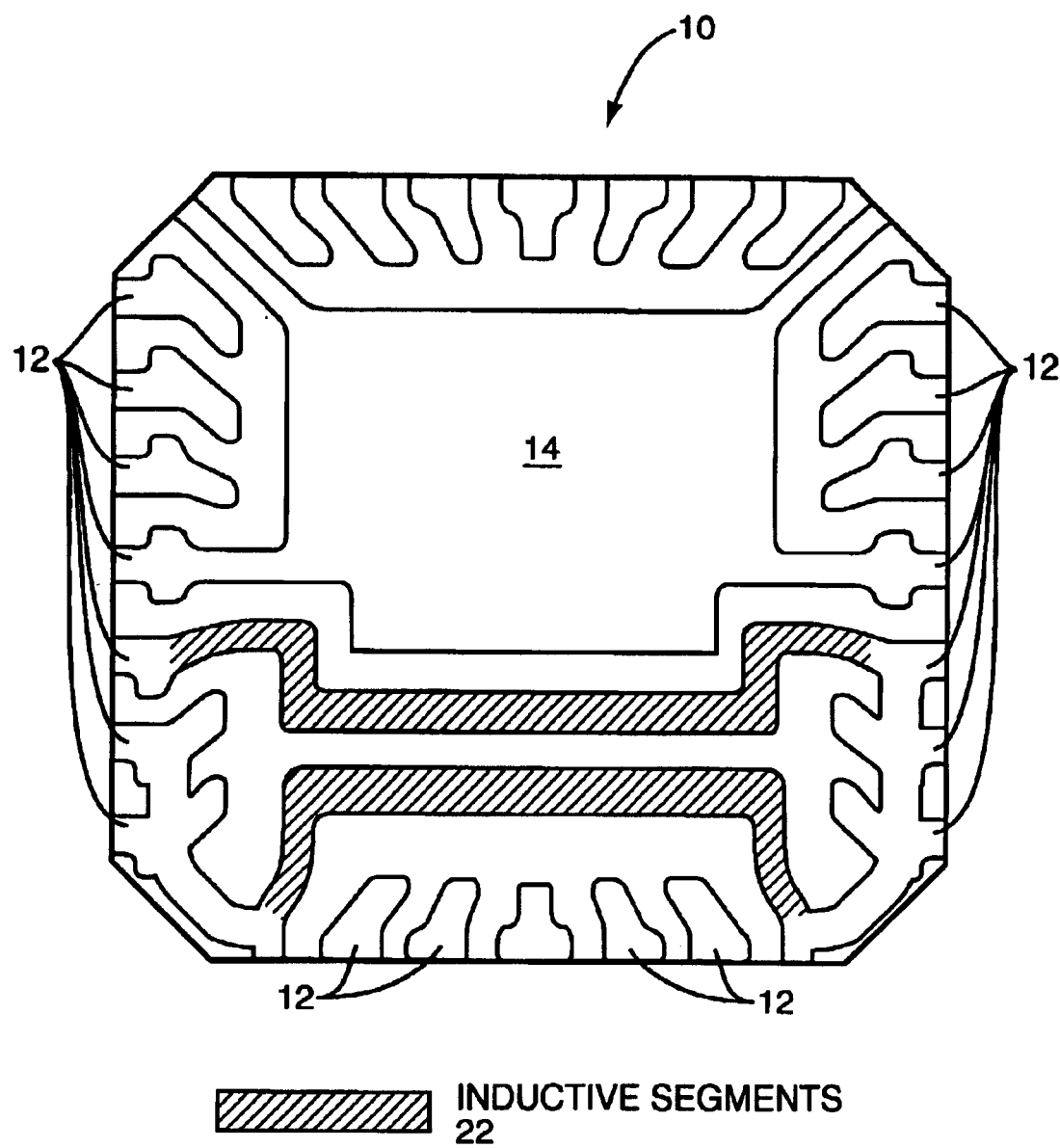
FIG. 7 is an alternate leadframe configuration according to a fourth embodiment of the present invention.

FIGS. 5–7 illustrate three exemplary inductive segment configurations within a leadframe 10. Preferably, the leadframe 10 is formed using traditional etching or stamping techniques to form the leads 12, die flag 14, and inductive segments 22. The material forming the parts of the leadframe 10 may vary depending on application or fabrication techniques. In the preferred embodiment, the leadframe 10 is formed of copper plated with nickel, which is subsequently plated with silver. Those skilled in the art will recognize that the leadframe 10 may be formed using various combinations of platings, materials, layers, and sections. Etching will use lithography and chemical etching to form the leadframe 10, wherein stamping will implement a tool to press and/or cut the leadframe 10 into the desired pattern and shape.

As noted, the actual inductor formed using the inductive segments 22 may incorporate all or a portion of any one inductive segment 22, or all or a portion of multiple inductive segments 22. Preferably, the inductive segments 22 are sized to provide substantially greater inductance than the wirebonds 20, and therefore, minimize the impact of the actual wirebonds 20 on the overall inductance provided by the inductive segments 22. During design and manufacturing processes, the value of a given inductor will vary based on the length, cross-sectional area, and shape of the inductive segments 22. The length of the inductive segments 22 used to form the inductor may be controlled by the selective positioning of the point of contact for the wirebonds 20. The points of connection for the wirebonds 20 to the inductive segments 22 may be further adjusted to effectively fine tune the inductance value of the inductor formed by the inductive segments 22. Accordingly, the inductive segments 22 are the inductive platform for forming inductors based on the electrical connections, which may be formed using wirebonds 20 or the actual leads 12. As illustrated above, inductors may be formed across multiple inductive segments 22 or within a single inductive segment 22. The inductors formed using the inductive segments 22 have proven to be substantially less lossy than inductors formed using wirebonds 20. Further, the inductive segments 22 can form the basis for significantly higher inductance values than were previously achievable using wirebonds 20. In certain applications, the inductors provide inductance value sufficiently high to minimize or eliminate the impact of the inductance in the wirebonds 20.

Figure 8:
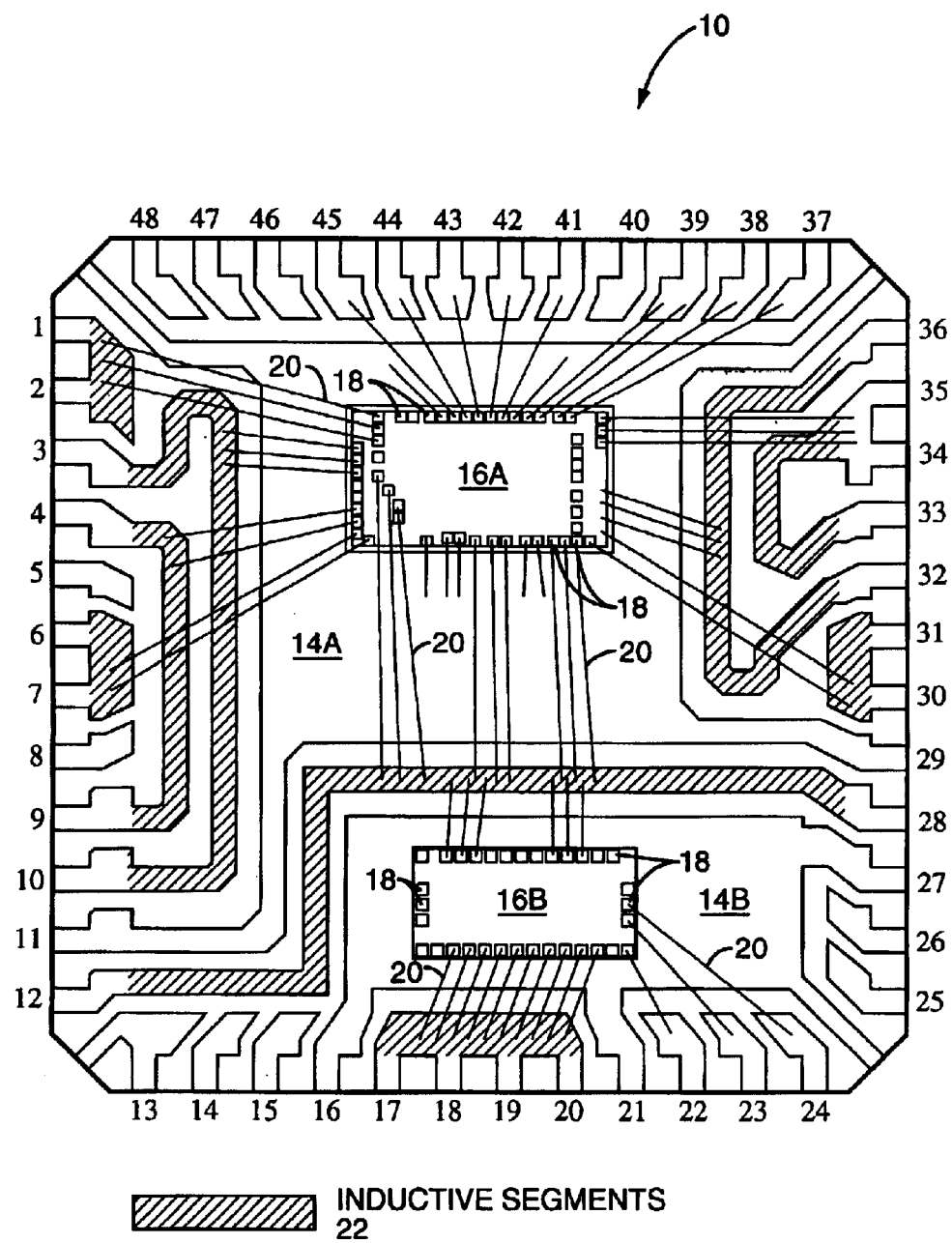
FIG. 8 is another leadframe alternative wherein the leadframe supports two semiconductor die.

With reference to FIG. 8, the leadframe 10 may be configured to provide multiple die flags 14A, 14B for multiple semiconductor die 16A, 16B. The leadframe 10 may incorporate various inductive segments 22, which may be used to form one or more inductors for use in association with the semiconductor die 16A, 16B or other circuitry.

The present invention provides for integrating inductors into a leadframe in a cost-effective and low-loss manner. The inductance values for the integrated inductors can be programmed within a given range based on the design of the leadframe 10 and the points of contact of the wirebonds 20. The maximum inductance for an inductive segment 22 is determined by the area available for the leadframe traces forming the inductive segments 22, wherein the final inductance value is selected or tuned by controlling the point of contact for the wirebonds 20. Further, within a given leadframe design, multiple electrical designs and circuits may be implemented wherein the required inductance is "dialed in" by controlling the position of the wirebonds 20. The programmability of the inductance values by controlling the wirebonds 20 reduces manufacturing and design times. The integration of large inductors into the leadframe 10 reduces semiconductor fabrication cost, as well as final assembly cost, due to the reduced component count and decreasing size due to integration. The present invention has value in analog, digital, and radio frequency applications.

Those skilled in the art will recognize improvements and modifications to the preferred embodiments of the present invention. All such improvements and modifications are considered within the scope of the concepts disclosed herein and the claims that follow.

What is claimed is:

1. A method for forming an inductor in a leadframe of a semiconductor package comprising:
    a) forming a leadframe comprising a die flag, leads, and an inductive segment;
    b) mounting a semiconductor die on the die flag;
    c) coupling the semiconductor die to a first point of the inductive segment using a wirebond; and
    d) coupling a second point of the inductive segment to one of the leads or the semiconductor die,
wherein the inductive segment is thinner than the die flag and the leads such that a bottom surface of the inductive segment is on a higher plane than bottom surfaces of the die flag and the leads and at least part of the inductor is formed between the first and second points of the inductive segment.

2. The method of claim 1 wherein the step of forming the leadframe comprises forming the leadframe from a unitary leadframe material.

3. The method of claim 1 wherein the step of forming the leadframe further comprises forming a second inductive segment.

4. The method of claim 3 further comprising coupling the second point of the inductive segment to a third point on the second inductive segment and coupling a fourth point on the second inductive segment to the one of the leads or the semiconductor die such that part of the inductor is formed between the first and second points of the inductive segment and at least part of a second inductor is formed between the third and fourth points of the second inductive segment.

5. The method of claim 4 wherein the second point of the inductive segment is coupled to the third point on the second inductive segment using a wirebond.

6. The method of claim 1 further comprising applying a molding compound for holding the leadframe, the semiconductor die, and the wirebond in place and forming a body for the semiconductor package.

7. The method of claim 1 wherein the step of forming the leadframe further comprises forming a plurality of die flags.

8. The method of claim 1 wherein the step of forming the leadframe further comprises forming a plurality of inductive segments.

9. The method of claim 1 wherein the inductive segment is substantially linear.

10. The semiconductor package of claim 1 wherein the inductive segment is substantially non-linear.

11. The semiconductor package of claim 1 wherein the inductive segment has a spiral shape.

12. The method of claim 1 wherein the second point of the inductive segment coupled to one of the leads, thereby forming the inductor between the one of the leads and the semiconductor die.

13. The method of claim 1 wherein the semiconductor die includes two bond pads, and the first point of the inductive segment is coupled to one of the two bond pads and the second point of the inductive segment is coupled to a second of the two bond pads, thereby forming the inductor between the two bond pads of the semiconductor die.

14. A method for forming an inductor in a leadframe of a semiconductor package comprising forming a leadframe comprising a die flag, leads, and at least one inductive segment from a unitary leadframe material, forming at least part of the inductor between two points of the inductive segment, coupling each of the two points of the inductive segment to one of the leads or a semiconductor die mounted on the die flag, wherein the inductance for the at least part of the inductor is determined by a distance between the two points and the inductive segment is thinner than the die flag and the leads such that a bottom surface of the inductive segment avoids contact with a surface contacting bottom surfaces of the die flag and the leads.

15. The method of claim 14 wherein the step of forming the leadframe further comprises forming a plurality of inductive segments.

16. The method of claim 15 further comprising coupling portions of each of the plurality of inductive segments in series to form a single inductor.

17. The method of claim 15 further comprising coupling a portion of each of the plurality of inductive segments between one of the leads or the semiconductor die and isolating the portion from one another to form separate inductors.

18. The method of claim 14 wherein the step of forming the leadframe further comprises forming the inductive segment such that the inductive segment is physically isolated from the die flag within the leadframe.

19. The method of claim 14 wherein the step of forming the leadframe further comprises forming the inductive segment such that one end of the inductive segment is physically connected to one of the leads within the leadframe.

20. The method of claim 14 wherein the step of forming the leadframe further comprises forming the inductive segment such that the inductive segment is physically connected between two of the leads within the leadframe.

21. A method for forming an inductor in a leadframe of a semiconductor package comprising:

a) forming a die flag, leads, and an inductive segment from a unitary leadframe material to create a leadframe;

b) mounting a semiconductor die on the die flag;

c) coupling the semiconductor die to a first point of the inductive segment using a wirebond; and d) coupling a second point of the inductive segment to one of the leads or the semiconductor die;

wherein least part of the inductor is formed between the first and second points of the inductive segment.

22. The method of claim 21 wherein the forming step further comprises forming the die flag, the leads, and the inductive segment such that a bottom surface of the inductive segment is on a higher plane than bottom surfaces of the die flag and the leads.

23. The method of claim 21 wherein the coupling the second point of the inductive segment step comprises coupling the second point of the inductive segment to one of the leads or the semiconductor die using a second wirebond.

24. The method of claim 21 wherein the forming step further comprises forming the inductive segment such that the second point of the inductive segment is directly connected to one of the leads, thereby performing the coupling the second point of the inductive segment step.

* * * * *